US010665158B2

(12) United States Patent
Lee et al.

(10) Patent No.: US 10,665,158 B2
(45) Date of Patent: May 26, 2020

(54) ORGANIC LIGHT EMITTING DISPLAY PANEL, ORGANIC LIGHT EMITTING DISPLAY DEVICE, AND REPAIRING METHOD OF THE SAME

(71) Applicant: LG DISPLAY CO., LTD., Seoul (KR)

(72) Inventors: Chulwoo Lee, Paju-si (KR); Kyungsu Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 140 days.

(21) Appl. No.: 15/202,088

(22) Filed: Jul. 5, 2016

(65) Prior Publication Data

US 2017/0193898 A1 Jul. 6, 2017

(30) Foreign Application Priority Data

Dec. 31, 2015 (KR) .................. 10-2015-0191753

(51) Int. Cl.
*G09G 3/00* (2006.01)
*G09G 3/3225* (2016.01)
*G09G 3/3266* (2016.01)
*G09G 3/3291* (2016.01)
*H01L 27/32* (2006.01)

(52) U.S. Cl.
CPC ........... *G09G 3/3225* (2013.01); *G09G 3/006* (2013.01); *G09G 3/3266* (2013.01); *G09G 3/3291* (2013.01); *H01L 27/3218* (2013.01); *H01L 27/3246* (2013.01); *H01L 27/3248* (2013.01); *H01L 27/3258* (2013.01); *H01L 27/3262* (2013.01); *G09G 2300/0452* (2013.01); *G09G 2300/0465* (2013.01); *G09G 2320/0233* (2013.01); *G09G 2320/045* (2013.01); *G09G 2330/08* (2013.01); *G09G 2330/10* (2013.01); *H01L 2227/323* (2013.01); *H01L 2251/568* (2013.01)

(58) Field of Classification Search
CPC ......... G09G 3/3233; G09G 2300/0413; G09G 2330/08; G09G 2330/10; G09G 2330/12
See application file for complete search history.

(56) References Cited

U.S. PATENT DOCUMENTS

| 7,884,785 | B2 * | 2/2011 | Yamashita | ........... | G09G 3/2074 |
| | | | | | 345/76 |
| 8,508,518 | B2 | 8/2013 | Uchino et al. | | |
| 8,581,271 | B2 * | 11/2013 | Shikina | ............... | H01L 51/5275 |
| | | | | | 257/40 |
| 9,129,923 | B1 * | 9/2015 | Han | .................... | H01L 27/3248 |

(Continued)

FOREIGN PATENT DOCUMENTS

| CN | 1534555 A | 10/2004 |
| CN | 202512325 U | 10/2012 |

(Continued)

*Primary Examiner* — Yuzhen Shen
(74) *Attorney, Agent, or Firm* — Birch, Stewart, Kolasch & Birch, LLP (57) ABSTRACT

Discussed is a panel including: a plurality of pixels, each pixel including a plurality of sub-pixels; and a single circuit part, wherein at least one of the plurality of sub-pixels in the each pixel has a plurality of emitting parts that are all light emitting, and wherein the single circuit part is connected to the plurality of emitting parts to drive the plurality of emitting parts to all emit light.

19 Claims, 10 Drawing Sheets

(56) References Cited

U.S. PATENT DOCUMENTS

| | | | | |
|---|---|---|---|---|
| 2004/0233140 A1* | 11/2004 | Jo | ............................ | G09G 3/325 |
| | | | | 345/76 |
| 2006/0186822 A1* | 8/2006 | Park | ...................... | G09G 3/3233 |
| | | | | 315/169.3 |
| 2007/0108443 A1* | 5/2007 | Kim | ..................... | H01L 27/3202 |
| | | | | 257/40 |
| 2008/0231168 A1* | 9/2008 | Choi | .................... | H01L 27/3246 |
| | | | | 313/500 |
| 2009/0206727 A1* | 8/2009 | Kim | ........................ | B82Y 10/00 |
| | | | | 313/500 |
| 2014/0319486 A1* | 10/2014 | Hong | ........................ | G09G 3/32 |
| | | | | 257/40 |
| 2014/0346475 A1* | 11/2014 | Cho | ..................... | H01L 51/5203 |
| | | | | 257/40 |
| 2015/0144925 A1* | 5/2015 | Baek | ................... | H01L 27/3213 |
| | | | | 257/40 |
| 2017/0062543 A1 | 3/2017 | Hsin | | |

FOREIGN PATENT DOCUMENTS

| | | |
|---|---|---|
| CN | 103913868 A | 7/2014 |
| CN | 105096765 A | 11/2015 |
| CN | 105097884 A | 11/2015 |

\* cited by examiner

ORGANIC LIGHT EMITTING DISPLAY PANEL, ORGANIC LIGHT EMITTING DISPLAY DEVICE, AND REPAIRING METHOD OF THE SAME

CROSS-REFERENCE TO RELATED APPLICATIONS

This application claims priority from and the benefit under 35 U.S.C. § 119 (a) of Korean Patent Application No. 10-2015-0191753 filed on Dec. 31, 2015, which is hereby incorporated by reference for all purposes as if fully set forth herein.

BACKGROUND OF THE INVENTION

Field of the Invention

Embodiments of the present inventions relate to an organic light emitting display panel, an organic light emitting display device, and a repairing method of the same.

Description of the Related Art

An organic light emitting display device as one of flat panel displays (FPDs) has high brightness and low operation voltage. Further, the organic light emitting display device is a self-light emitting device, and therefore has a high contrast ratio. Furthermore, the organic light emitting display device can be realized as an ultra-thin display device. Also, since the organic light emitting display device has a response time of several micro seconds (μs), it is suitable for displaying a moving image. The organic light emitting display device has no limitation of a viewing angle, and is stable at a low temperature. Since the organic light emitting display device is driven at a low direct current (DC) voltage of 5 V to 15 V, it is easy to manufacture and design a driving circuit of the organic light emitting display device.

Therefore, the organic light emitting display device having the above-described advantages has been recently applied to various IT devices such as TVs, monitors, cellular phones, etc. Hereinafter, a basic structure of the organic light emitting display device will be described in more detail.

The organic light emitting display device basically includes an array element and an organic light emitting element. The array element includes a switching transistor connected to gate and data lines and at least one driving transistor connected to the organic light emitting element. Further, the organic light emitting element includes a first electrode connected to the driving transistor, an organic light emitting layer, and a second electrode.

The organic light emitting display device having the above-described configuration may be configured to display full color by forming the organic light emitting layer of light emitting materials which respectively emit red, green, and blue lights. Otherwise, the organic light emitting display device may be configured to display full color by forming the entire organic light emitting layer of an organic light emitting material which emits a white light so as to emit a white light, disposing red, green, and blue color filters corresponding to respective sub-pixels, and allowing the white light emitted from the organic light emitting layer which emits a white light to pass through the red, green, and blue color filters.

However, during a manufacturing process of the organic light emitting display device having the above-described configuration, the organic light emitting element may not be driven in a normal manner due to deterioration in characteristics of the transistor or occurrence of an internal short.

As such, if a transistor formed in a sub-pixel is not driven in a normal manner, a current or voltage is not applied to an organic light emitting element connected to the transistor which is not driven in a normal manner, so that darkening occurs. Otherwise, if a source electrode and a drain electrode of a driving transistor are shorted, a voltage applied to the source electrode is not turned ON/OFF but is directly applied to the drain electrode, so that the sub-pixel is always in an ON state and brightening occurs.

Further, in a sub-pixel in which brightening occurs, electrical connection between a driving transistor and a first electrode of an organic light emitting element is cut by laser cutting and then, the first electrode and a second electrode of the organic light emitting element in the sub-pixel in which brightening occurs are electrically connected by welding, so that darkening occurs.

Meanwhile, a defect of a sub-pixel in which darkening occurs may be detected using sensing data, and another sub-pixel may be substituted for the sub-pixel and driven. Then, an algorithm for realizing a specific color may be applied. However, according to this method, it is difficult to realize a natural color and a circuit part and a light emitting part of a normal sub-pixel may be shorted due to misapplication of the algorithm. Accordingly, there have been demanded an organic light emitting display panel, an organic light emitting display device, and a repairing method thereof for solving such problems.

SUMMARY OF THE INVENTION

According to an embodiment of the present invention, a panel includes: a plurality of pixels, each pixel includes including a plurality of sub-pixels; and a single circuit part, wherein at least one of the plurality of sub-pixels in the each pixel is has a plurality of emitting parts that are separately all light emitting, and wherein a the single circuit part is connected to the plurality of emitting parts to drive the plurality of emitting parts to separately all emit light.

According to another embodiment of the present invention, an organic light emitting display device includes: the panel which further includes: a plurality of data lines; a plurality of gate lines; a data driver to drive the plurality of data lines; a gate driver to drive the plurality of gate lines; and a timing controller to control the data driver and the gate driver.

According to another embodiment of the present invention, a repairing method of a panel includes: forming a single circuit part and a plurality of pixels, each pixel includes including a plurality of sub-pixels, wherein at least one of the plurality of sub-pixels in the each pixel is has a plurality of emitting parts that are separately light emitting, and wherein a the single circuit part is connected to the plurality of emitting parts to drive the plurality of emitting parts to separately emit light; determining whether the plurality of emitting parts are able to emit light; and electrically disconnecting at least one light emitting part among the plurality of light emitting parts from the single circuit part when the at least one light emitting part does not emit the light.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Hereinafter, example embodiments of the present disclosure will be described in detail with reference to the accompanying drawings. The following example embodiments are provided for sufficiently conveying the concept of the present disclosure to those skilled in the art. Therefore, the present disclosure is not limited to the following example embodiments themselves but can be modified and changed in other embodiments.

Advantages and features of the present disclosure, and methods for accomplishing the same will be more clearly understood from example embodiments described below with reference to the accompanying drawings. However, the present disclosure is not limited to the following example embodiments but may be implemented in various different forms. The example embodiments are provided only to complete disclosure of the present disclosure and to fully provide a person having ordinary skill in the art to which the present disclosure pertains with the category of the invention, and the present disclosure will be defined by the appended claims. Like reference numerals generally denote like elements throughout the present specification. In the drawings, the sizes and relative sizes of layers and regions may be exaggerated for clarity.

When an element or layer is referred to as being "on" another element or layer, it may be directly on the other element or layer, or intervening elements or layers may be present. Meanwhile, when an element is referred to as being "directly on" another element, any intervening elements may not be present.

The spatially-relative terms such as "below", "beneath", "lower", "above", "upper", etc., may be used herein for ease of description to describe the relationship of one element or components with another element(s) or component(s) as illustrated in the drawings. It will be understood that the spatially relative terms are intended to encompass different orientations of the element in use or operation, in addition to the orientation depicted in the drawings. For example, if the element in the drawings is turned over, elements described as "below" or "beneath" other elements would then be oriented "above" the other elements. Thus, the example term "below" can encompass both an orientation of above and below.

Further, in describing components of the present disclosure, terms such as first, second, A, B, (a), (b), etc., can be used. These terms are used only to differentiate the components from other components. Therefore, the nature, order, sequence, etc., of the corresponding components are not limited by these terms.

Figure 1:
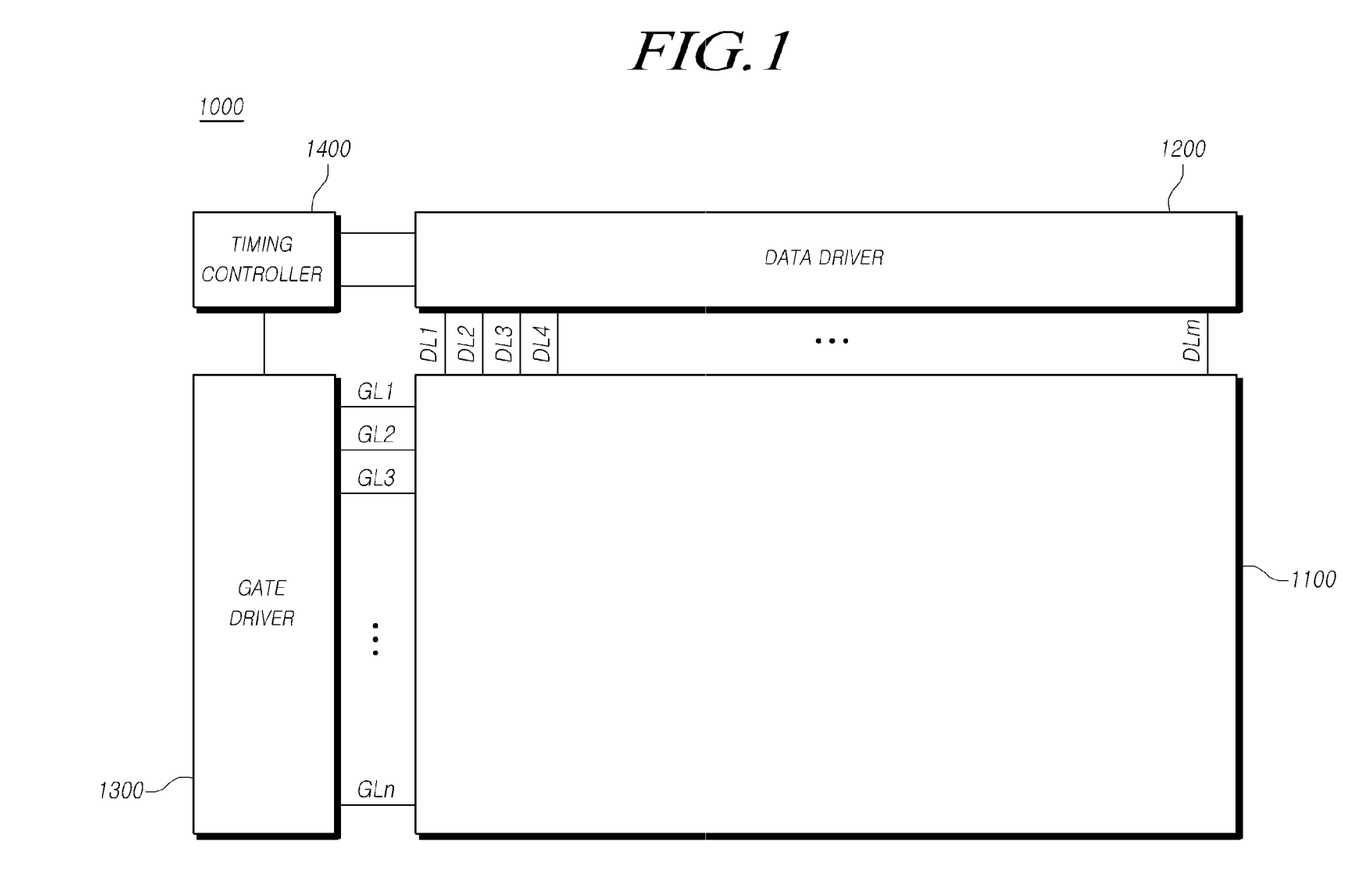
FIG. 1 is a schematic system configuration view of an organic light emitting display device according to the present example embodiments.

FIG. 1 is a schematic system configuration view of an organic light emitting display device according to the present example embodiments. Referring to FIG. 1, an organic light emitting display device 1000 according to the present example embodiments includes an organic light emitting display panel 1100 in which a plurality of data lines DL to DLm and a plurality of gate lines GL1 to GLn are disposed and a plurality of sub-pixels is disposed, a data driver 1200 configured to drive the plurality of data lines DL to DLm, a gate driver 1300 configured to drive the plurality of gate lines GL1 to GLn, and a timing controller 1400 configured to control the data driver 1200 and the gate driver 1300. Meanwhile, in the present example embodiments, the terms "data line" and "scan line" may be used without distinction.

The data driver 1200 drives the plurality of data lines by supplying a data voltage to the plurality of data lines. Further, the gate driver 1300 sequentially drives the plurality of gate lines by sequentially supplying a scan signal to the plurality of gate lines.

Further, the timing controller 1400 controls the data driver 1200 and the gate driver 1300 by supplying a control signal to the data driver 1200 and the gate driver 1300. The timing controller 1400 starts a scan according to timing implemented in each frame, converts an image data input from the outside into a data signal form used by the data driver 1200, and outputs the converted image data, and controls a driving of data at a proper time according to the scan.

The gate driver 1300 sequentially supplies a scan signal of an ON or OFF voltage to the plurality of gate lines according to the control of the timing controller 1400 to sequentially drive the plurality of gate lines. Further, the gate driver 1300 may be positioned on only one side of the organic light emitting display panel 1100 as illustrated in FIG. 1, or may be positioned on both sides of the organic light emitting display panel 1100 if necessary or desired, depending on a driving scheme or a design scheme of the organic light emitting display panel.

Further, the gate driver 1300 may include one or more gate driver integrated circuits. Each of the gate drive integrated circuits may be connected to a bonding pad of the organic light emitting display panel 1100 through a Tape Automated Bonding (TAB) method or a Chip On Glass (COG) method, or implemented in a Gate In Panel (GIP) type and directly formed in the organic light emitting display panel 1100. Otherwise, each of the gate drive integrated circuits may be integrated and formed in the organic light emitting display panel 1100 if necessary or desired.

Alternatively, each of the gate drive integrated circuits may be implemented in a Chip On Film (COF) type. In this instance, a gate driver chip corresponding to each of the gate drive integrated circuits may be mounted on a flexible film and one end of the flexible film may be bonded to the organic light emitting display panel 1100.

If a specific gate line is opened, the data driver 1200 converts an image data received from the timing controller 1400 into a data voltage of an analog form and supplies the data voltage to the plurality of data lines to drive the plurality of data lines. Further, the data driver 1200 may include at least one source driver integrated circuit and thus, drive the plurality of data lines.

Each of the source driver integrated circuits may be connected to a bonding pad of the organic light emitting display panel 1100 through the Tape Automated Bonding (TAB) method or the Chip On Glass (COG) method, or directly formed in the organic light emitting display panel 1100. Otherwise, each of the source driver integrated circuits may be integrated and formed in the organic light emitting display panel 1100 if necessary or desired.

Alternatively, each of the source driver integrated circuits may be implemented in the Chip On Film (COF) type. In this instance, a source driver chip corresponding to each of the source driver integrated circuits may be mounted on a flexible film and one end of the flexible film may be bonded to at least one source printed circuit board and the other end thereof may be bonded to the organic light emitting display panel 1100.

The source printed circuit board may be connected to a control printed circuit board through a connector such as a flexible flat cable (FFC) or a flexible printed circuit (FPC). The timing controller 1400 is disposed in the control printed circuit board.

Further, a power controller configured to supply a voltage or current to the organic light emitting display device 1100, the data driver 1200, and the gate driver 1300 or control a voltage or current to be supplied thereto may be further disposed in the control printed circuit board. The above-described source printed circuit board and control printed circuit board may be formed into one printed circuit board.

Meanwhile, an organic light emitting element according to the present example embodiments includes a first electrode, an organic light emitting layer, and a second electrode. The organic light emitting layer may be disposed in each sub-pixel or may be disposed on the entire surface of a lower substrate.

Herein, an electrode connected to a thin film transistor configured to control emission of each sub-pixel of the organic light emitting display panel 1100 is referred to as the first electrode, and an electrode disposed on the entire surface of the display panel or disposed to include two or more pixels is referred to as the second electrode. If the first electrode is an anode electrode, the second electrode is a cathode electrode, and vice versa. In the following, the first electrode will be described as an anode electrode in an example embodiment and the second electrode will be described as a cathode electrode in an example embodiment, but the present disclosure is not limited thereto.

Meanwhile, each pixel further includes driving voltage lines and reference voltage lines disposed so as to be parallel with the data lines DL to DLm. Further, a plurality of transistors disposed in each sub-pixel may include source and drain electrodes branched from a data line, a driving voltage line, or a reference voltage line.

Meanwhile, a pixel according to the present example embodiments includes one or more sub-pixels. For example, the pixel according to the present example embodiments may include two to four sub-pixels. Colors defined in the sub-pixels may include red (R), green (G), blue (B), and selectively white (W), but the present example embodiments are not limited thereto. However, one pixel of the organic light emitting display device 1000 according to the following example embodiments will be described as including at least one white (W) sub-pixel.

Further, in the organic light emitting display panel 1100, red (R), white (W), green (G), and blue (B) may be repeatedly aligned. In the organic light emitting display panel 1100 having such color alignment, a dark spot or bright spot defect caused by a defect such as impurities or line short in a sub-pixel may be expressed.

Meanwhile, during a manufacturing process of the organic light emitting display device, the organic light emitting element may not be driven in a normal manner due to deterioration in characteristics of the transistor or occurrence of an internal short. As such, if a transistor formed in a sub-pixel is not driven in a normal manner, a current or voltage may not be applied to an organic light emitting element connected to the transistor which is not driven in a normal manner, so that darkening may occur.

Otherwise, if a source electrode and a drain electrode of a driving transistor are shorted, a voltage applied to the source electrode may not be turned ON/OFF but may be directly applied to the drain electrode, so that a specific sub-pixel may be always in an ON state and brightening may occur.

Further, in a sub-pixel in which brightening occurs, electrical connection between a driving transistor and a first electrode of an organic light emitting element is cut by laser cutting and then, the first electrode and a second electrode of the organic light emitting element in the sub-pixel in which brightening occurs are electrically connected by welding, so that darkening occurs.

Meanwhile, a defect of a sub-pixel in which darkening occurs may be detected using sensing data, and another sub-pixel may be substituted for the sub-pixel and driven. Then, an algorithm for realizing a specific color may be applied. However, according to this method, it is difficult to realize a natural color and a circuit part and a light emitting part of a normal sub-pixel may be shorted due to misapplication of the algorithm.

The present example embodiments are provided to solve this problem. Since at least one sub-pixel among a plurality of sub-pixels disposed in one pixel is configured to drive two light emitting parts with one circuit part, when a bright spot or a dark spot occurs in one light emitting part of this sub-pixel, the other normal light emitting parts where a bright spot or a dark spot does not occur can be operated in a normal manner. Accordingly, the above-described problem can be solved.

Hereinafter, the present example embodiments will be described in detail with reference to the accompanying drawings.

Figure 2:
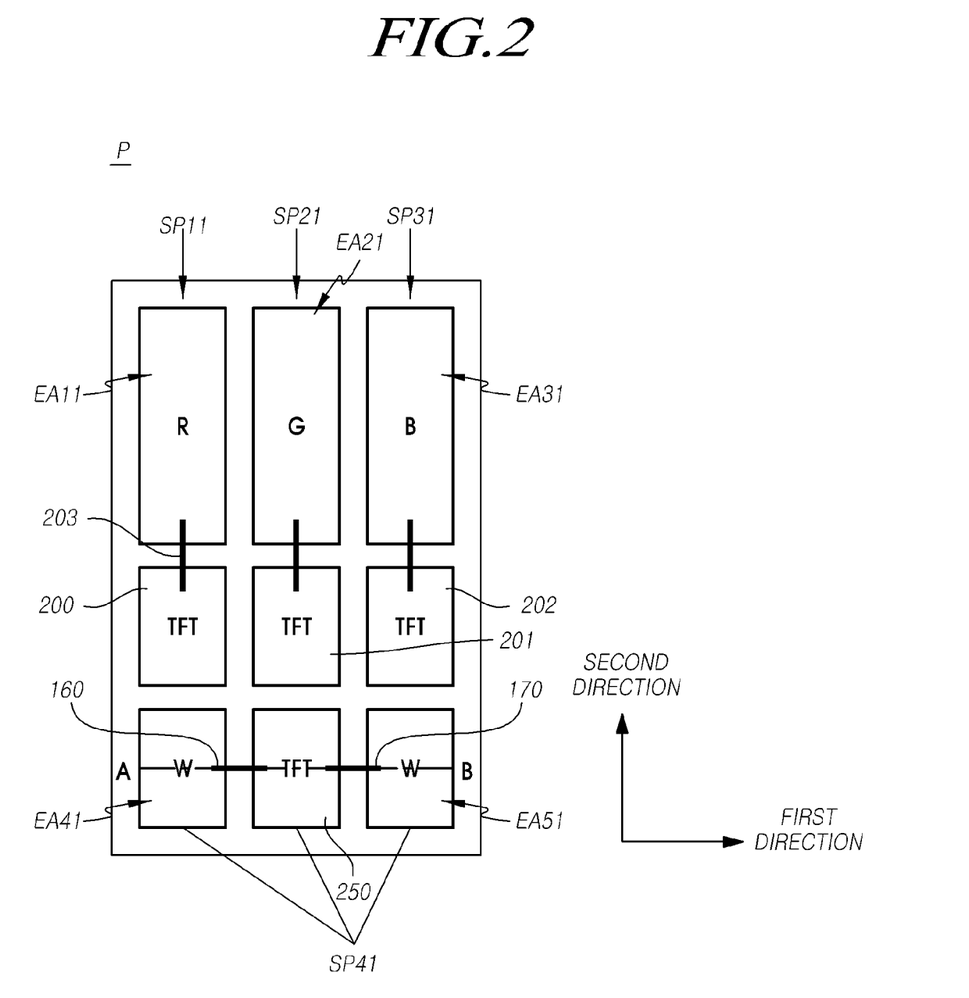
FIG. 2 is a plane view illustrating a pixel of an organic light emitting display device according to a first example embodiment.

FIG. 2 is a plane view illustrating a pixel of an organic light emitting display device according to a first example embodiment. Referring to FIG. 2, one pixel P of the organic light emitting display device according to the first example embodiment may include four sub-pixels. To be specific, the pixel P includes a first sub-pixel SP11, a second sub-pixel SP21, a third sub-pixel SP31, and a fourth sub-pixel SP41.

Herein, the first sub-pixel SP11 may be a red (R) sub-pixel, the second sub-pixel SP21 may be a green (G) sub-pixel, the third sub-pixel SP31 may be a blue (B) sub-pixel, and the fourth sub-pixel SP41 may be a white (W) sub-pixel, but may not be limited thereto. However, the first to fourth sub-pixels SP11, SP12, SP13, and SP14 may emit lights of different colors and thus increase a color reproduction range.

Meanwhile, the first sub-pixel SP11 includes a first light emitting part EA11 and a first circuit part 200, the second sub-pixel SP21 includes a second light emitting part EA21 and a second circuit part 201, and the third sub-pixel SP31 includes a third light emitting part EA31 and a third circuit part 202. The light emitting part and the circuit part in each sub-pixel may be connected to each other through a connection line 203. Herein, the connection line 203 may be a part of a first electrode of an organic light emitting element disposed in each sub-pixel.

Although FIG. 2 illustrates a configuration in which the first to third light emitting parts EA11, EA21, and EA31 have the same area, the organic light emitting display device according to the first example embodiment is not limited thereto. The first to third light emitting parts EA11, EA21, and EA31 of the organic light emitting display device according to the first example embodiment may have different areas. Further, the area of each of the first to third light emitting parts EA11, EA21, and EA31 may be different from the sum of the areas of the fourth and fifth light emitting parts EA41 and EA51. Accordingly, organic light emitting elements different in life may be appropriately disposed in respective light emitting parts. Further, the organic light emitting display device according to the first example embodiment may have a configuration in which the first to third circuit parts 200, 201, and 202 may also have the same area or different areas.

Meanwhile, the fourth sub-pixel SP41 may include two light emitting parts EA41 and EA51 and one circuit part 250. To be specific, the fourth sub-pixel SP41 may include the fourth light emitting part EA41 and the fifth light emitting part EA51 and the fourth circuit part 250. Herein, the fourth light emitting part EA41 and the fifth light emitting part EA51 may be symmetrically disposed in a first direction (horizontal direction) with respect to the fourth circuit part 250. In this instance, the fourth light emitting part EA41 and the fifth light emitting part EA51 may share the fourth circuit part 250. That is, the two light emitting parts EA41 and EA51 may be driven by the fourth circuit part 250.

Although FIG. 2 illustrates a configuration in which two light emitting parts are driven by one circuit part in the fourth sub-pixel SP41, the organic light emitting display device according to the first example embodiment is not limited thereto as long as a plurality of light emitting parts is driven by one circuit part in one sub-pixel. Further, FIG. 2 illustrates a configuration in which a plurality of light emitting parts is driven by one circuit part in one sub-pixel of one pixel P, but the organic light emitting display device according to the first example embodiment is not limited thereto. A plurality of light emitting parts may be driven by one circuit part in one or more sub-pixels of one pixel P.

Meanwhile, the two light emitting parts EA41 and EA51 of the fourth sub-pixel SP41 may emit a white (W) light. When a bright spot or a dark spot occurs in any one of the two light emitting parts EA41 and EA51, even if the first electrode (anode electrode) of the organic light emitting element included in the light emitting part EA41 or EA51 where a bright spot or a dark spot occurs is disconnected from the fourth circuit part 250, the other light emitting part may emit a white (W) light. Therefore, it is possible to implement a clear white (W) light as compared with the instance where the white (W) sub-pixel is entirely shorted.

For example, if a bright spot occurs in the fourth light emitting part EA41 of the fourth sub-pixel SP41 due to impurities, a first electrode 160 between the fourth light emitting part EA41 and the fourth circuit part 250 is cut. Herein, the first electrode 160 may be cut by a laser or the like. To be specific, the first electrode 160 may be cut in a region where the fourth light emitting part EA41 is connected to the fourth circuit part 250.

Herein, since the first electrode 160 is cut, a connection between driving transistors disposed in the fourth light emitting part EA41 and the fourth circuit part 250 may be cut. Thus, the fourth light emitting part EA41 and the fourth circuit part 250 are electrically shorted, and thus, the fourth light emitting part EA41 cannot emit a light.

However, since the fifth light emitting part EA51 is connected to the fourth circuit part 250, a signal generated from the fourth circuit part 250 may be transferred to the fifth light emitting part EA51. That is, even when the fourth light emitting part EA41 is shorted from the fourth circuit part 250, the fifth light emitting part EA51 can emit a white (W) light. Therefore, it is possible to implement a clear white (W) light as compared with the instance where the white (W) sub-pixel is entirely shorted.

Further, if a bright spot or a dark spot occurs in the fifth light emitting part EA51 of the fourth sub-pixel SP41, a first electrode 170 between the fifth light emitting part EA51 and the fourth circuit part 250 may be cut to short the fifth light emitting part EA51 and the fourth circuit part 250.

Although FIG. 2 illustrates a configuration in which the fourth light emitting part EA41 and the fifth light emitting part EA51 of the fourth sub-pixel SP41 have the same area, the organic light emitting display device according to the first example embodiment is not limited thereto. The fourth light emitting part EA41 and the fifth light emitting part EA51 may have different areas.

The fourth sub-pixel SP41 including the two light emitting parts EA41 and EA51 may be positioned on or under the first to third sub-pixels SP11, SP21, and SP31 in a plane view (FIG. 2 illustrates a configuration in which the fourth sub-pixel is positioned under the first to third sub-pixels). That is, the fourth sub-pixel SP41 may be disposed in a direction intersecting with a direction in which the first to third sub-pixels SP11, SP21, and SP31 are disposed.

To be specific, the first to third sub-pixels SP11, SP21, and SP31 may be repeatedly disposed in the first direction and the fourth sub-pixel SP41 may be disposed in a second direction intersecting with the first direction. Since the fourth sub-pixel SP41 is disposed in the direction intersecting with the direction in which the first to third sub-pixels SP11, SP21, and SP31 are disposed, an aperture ratio of the organic light emitting display panel can be improved.

Figure 3:
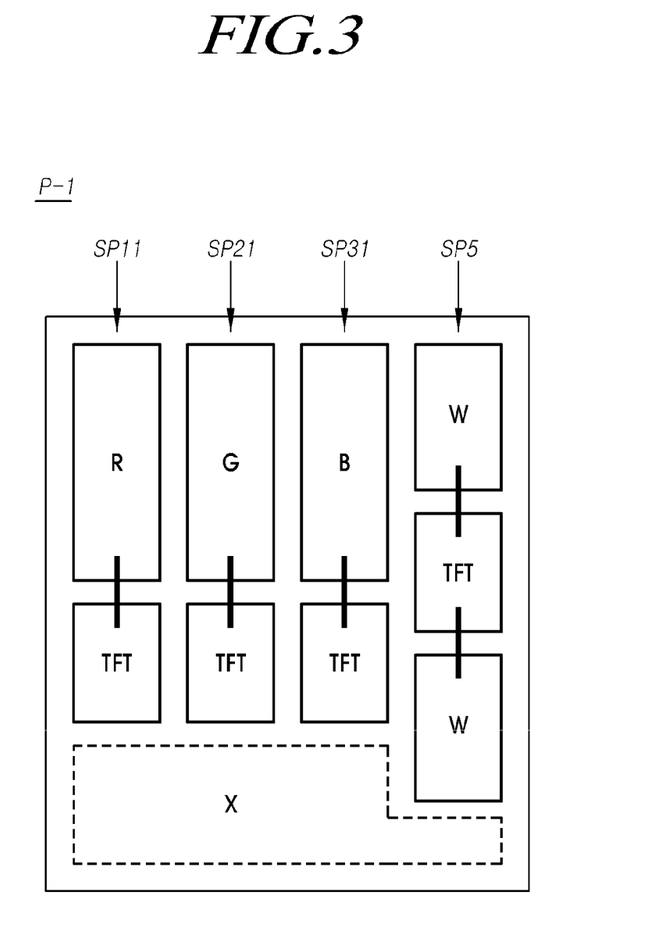
FIG. 3 is a plane view of an organic light emitting display device according to a comparative example.

Details thereof will be described with reference to FIG. 3. FIG. 3 is a plane view of an organic light emitting display device according to a comparative example. The organic light emitting display device according to the comparative example may include the same components as those of the organic light emitting display device according to the first example embodiment. The redundant description thereof may be omitted herein. Further, like components are assigned like reference numerals.

Referring to FIG. 3, one pixel P-1 may include four sub-pixels SP11, SP21, SP31, and SP5, and the fourth sub-pixel SP5 may include two light emitting parts and one circuit part. Herein, if the first to fourth sub-pixels SP11, SP21, SP31, and SP5 are sequentially disposed in the first direction, there is an extra region X in the pixel P-1. That is, in the organic light emitting display device according to the comparative example, an aperture ratio may be decreased by the region X per pixel P-1.

Further, if the areas of light emitting parts disposed in the fourth sub-pixel SP5 are reduced in order to solve this problem, the life of an organic light emitting element disposed in the fourth sub-pixel SP5 may be shorter than the life of organic light emitting elements respectively disposed in the first to third sub-pixels SP11, SP21, and SP31.

Meanwhile, as illustrated in FIG. 2, when the fourth sub-pixel SP41 is disposed in the direction intersecting with the direction in which the first to third sub-pixels SP11, SP21, and SP31 are disposed, the plurality of light emitting parts and the plurality of circuit parts are disposed in the pixel P without a wasted space. Therefore, an aperture ratio can be improved.

Further, in the an organic light emitting display device according to the first example embodiment, the light emitting part is driven as being divided into two parts in the fourth sub-pixel SP41 that emits a white (W) light. Therefore, the visibility can be improved. To be specific, a dark spot in the white (W) sub-pixel has a high visibility. In this instance, the white (W) light emitting part where a defect occurs is shorted from the circuit part and the other white (W) light emitting part is driven. Therefore, the visibility of the dark spot in the white (W) sub-pixel can be reduced.

Figure 4:
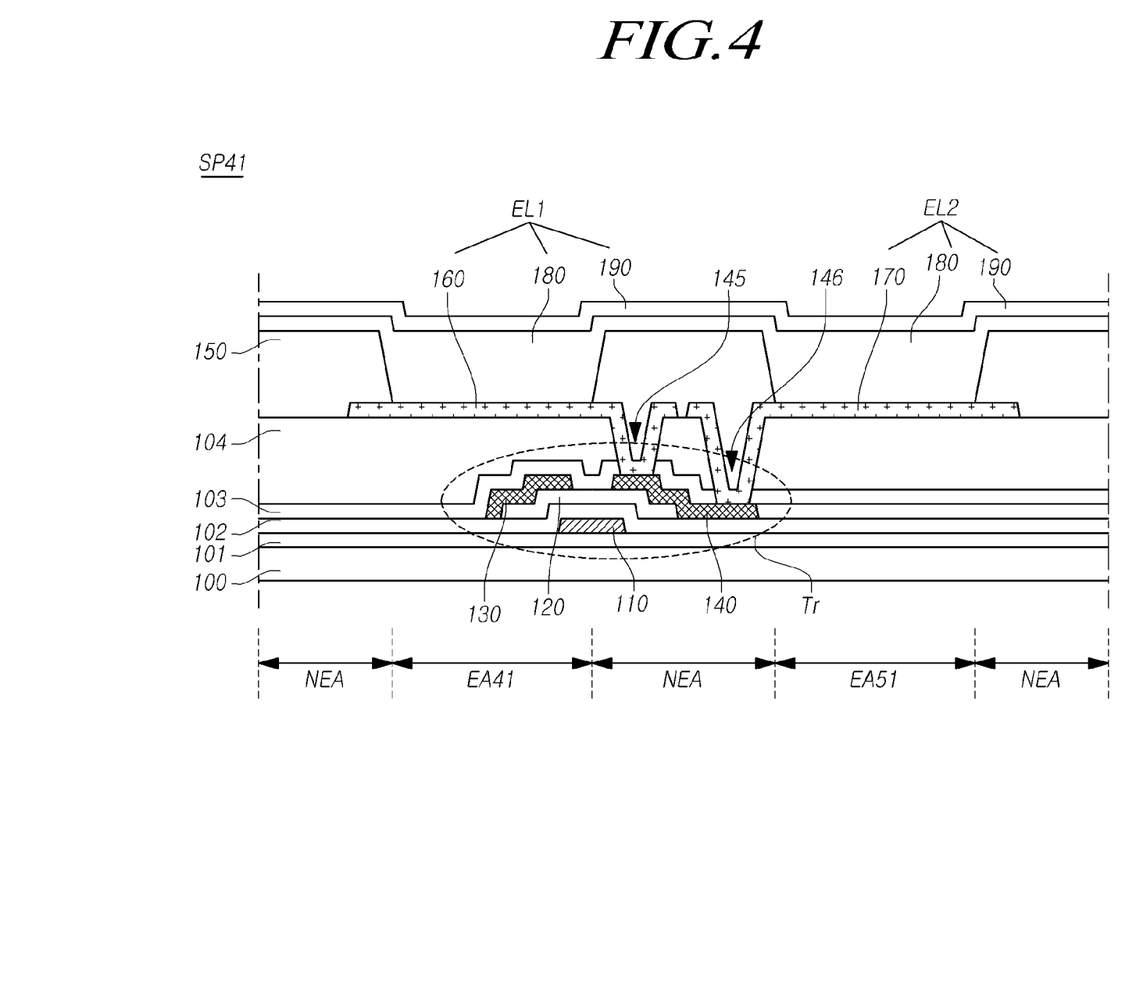
FIG. 4 is a cross-sectional view taken along a line A-B in FIG. 2.

This configuration will be described in detail with reference to FIG. 4. FIG. 4 is a cross-sectional view taken along a line A-B in FIG. 2. Referring to FIG. 4, a fourth sub-pixel SP4 according to the first example embodiment may include at least one transistor Tr and two organic light emitting elements.

To be specific, a buffer layer 101 is disposed on a substrate 100, and a gate electrode 110 is disposed on the buffer layer 101. A gate insulation film 102 is disposed on the gate electrode 110, and an active layer 120 overlapped with the gate electrode 110 is disposed on the gate insulation film 102. Further, a drain electrode 130 and a source electrode 140 are disposed so as to be overlapped with the active layer 120 and separate from each other. As such, the transistor Tr may be disposed on the substrate 100. Herein, the transistor Tr may be a driving transistor that drives the organic light emitting elements.

An interlayer insulation film 103 is disposed on the drain electrode 130 and the source electrode 140. An overcoating layer 104 is disposed on the interlayer insulation film 103. Further, contact holes 145 and 146 through which the source electrode 140 is exposed may be formed in the interlayer insulation film 103 and the overcoating layer 104. Herein, there may be formed two contact holes 145 and 146 through which the source electrode 140 is exposed. To be specific, the first contact hole 145 and the second contact hole 146 through which apart of the source electrode 140 is exposed may be formed in the interlayer insulation film 103 and the overcoating layer 104.

Further, the source electrode 140 and a first electrode 160 of a first organic light emitting element EL1 may be connected through the first contact hole 145. Furthermore, the source electrode 140 and a first electrode 170 of a second organic light emitting element EL2 may be connected through the second contact hole 146. Although FIG. 4 illustrates a configuration in which the source electrode 140 is connected to each of the first electrodes 160 and 170 of the organic light emitting elements EL1 and EL2, respectively, the present example embodiment is not limited thereto. The drain electrode 130 may be connected to each of the first electrodes 160 and 170 of the organic light emitting elements EL1 and EL2, respectively.

Also, a bank pattern 150 that partially exposes top surfaces of the first electrode 160 of the first organic light emitting element EL1 and the first electrode 170 of the second organic light emitting element EL2 is disposed on the overcoating layer 104. The bank pattern 150 may define light emitting regions EA41 and EA51 and a non-light emitting region NEA. An organic light emitting layer 180 is disposed on the bank pattern 150 and the first electrodes 160 and 170 of the first and second organic light emitting elements EL1 and EL2, respectively. A second electrode 190 of the first and second organic light emitting elements EL1 and EL2 is disposed on the organic light emitting layer 180.

Although FIG. 4 illustrates a configuration in which the first organic light emitting element EL1 and the second organic light emitting element EL2 share the organic light emitting layer 180 and the second electrode 190, the organic light emitting display device according to the first example embodiment is not limited thereto. The organic light emitting layer and the second electrode may be disposed in each of the first electrode 160 of the first organic light emitting element EL1 and the first electrode 170 of the second organic light emitting element EL2.

That is, as illustrated in FIG. 4, the first organic light emitting element EL1 and the second organic light emitting element EL2 may be driven by the driving transistor Tr. Herein, if the fourth light emitting region EA41 is defective, the first electrode 160 of the first organic light emitting element EL1 may be electrically disconnected from the transistor Tr. If the fifth light emitting region EA51 is defective, the first electrode 170 of the second organic light emitting element EL2 may be electrically disconnected from the transistor Tr.

Figure 5:
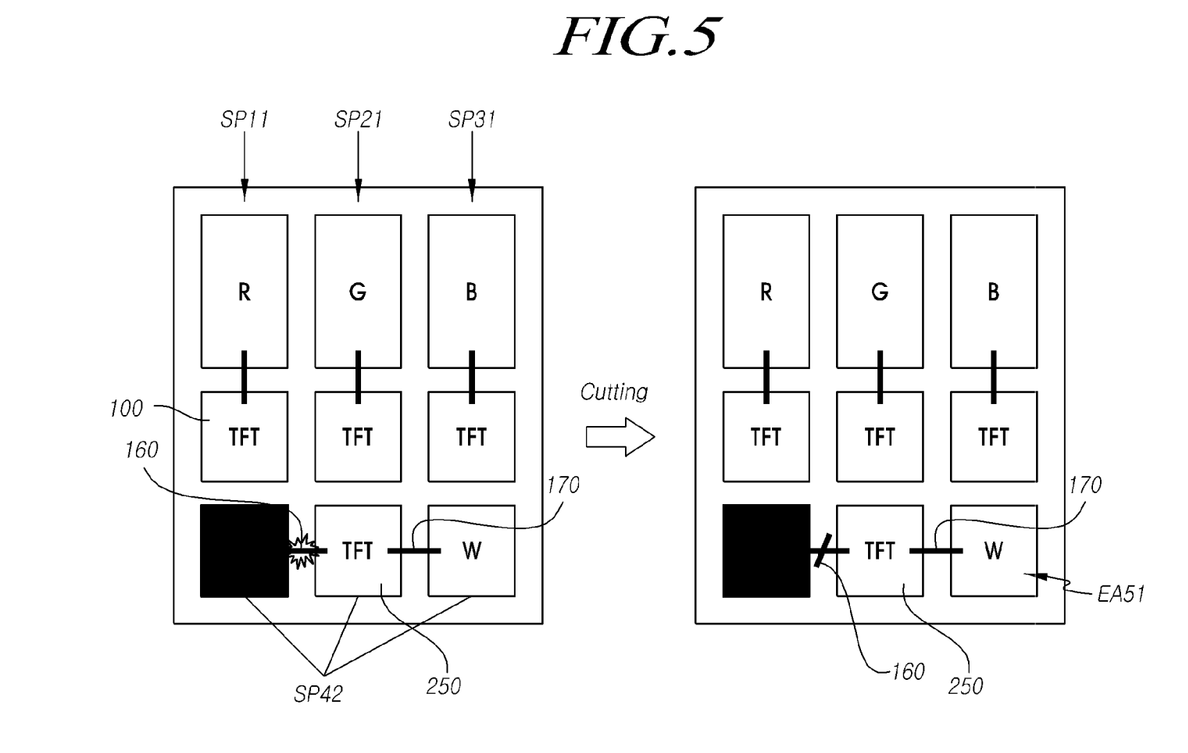
FIG. 5 through FIG. 7 are diagrams illustrating a driving method of a fourth sub-pixel when a defect occurs in a fourth light emitting region of the fourth sub-pixel of the organic light emitting display device according to the first example embodiment.
Figure 6:
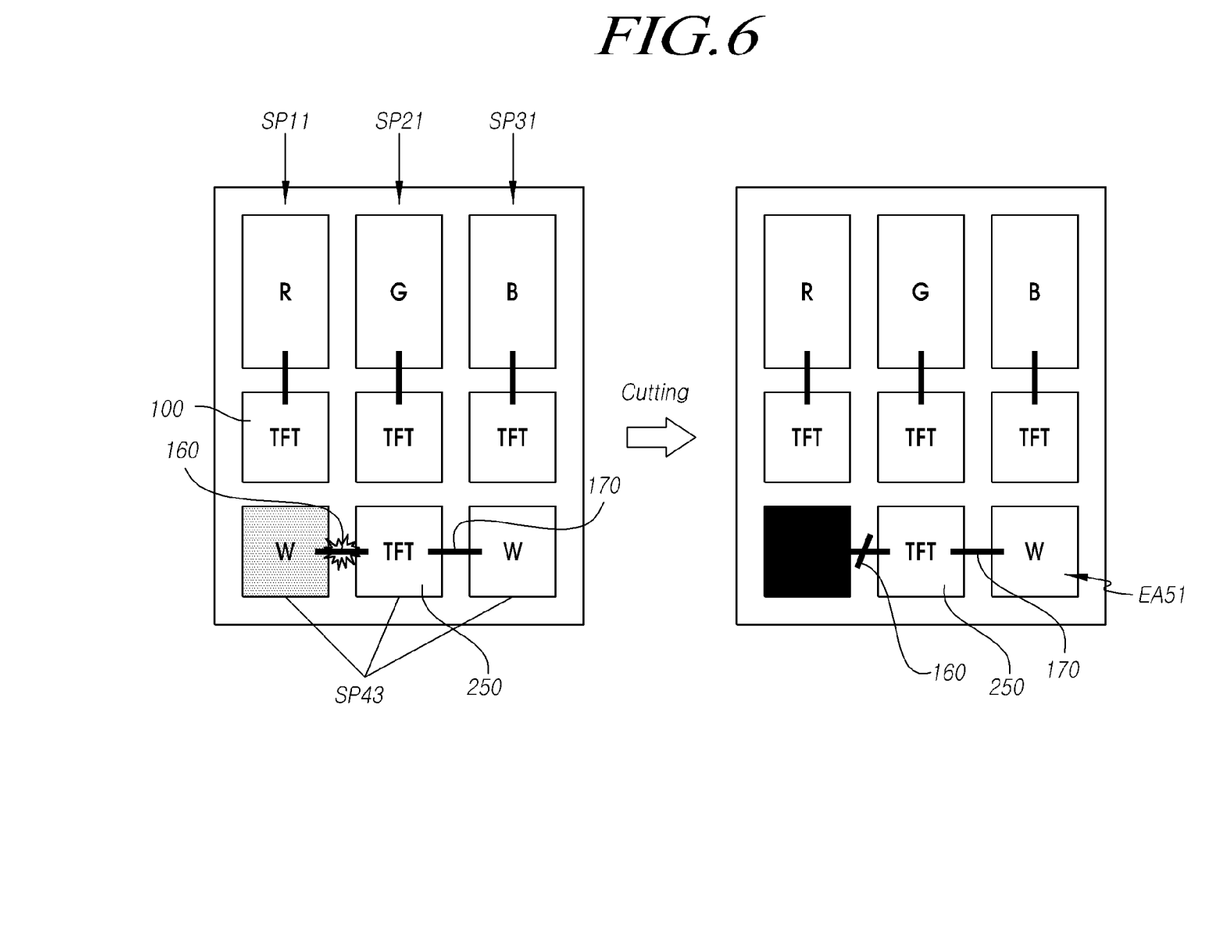
Figure 7:
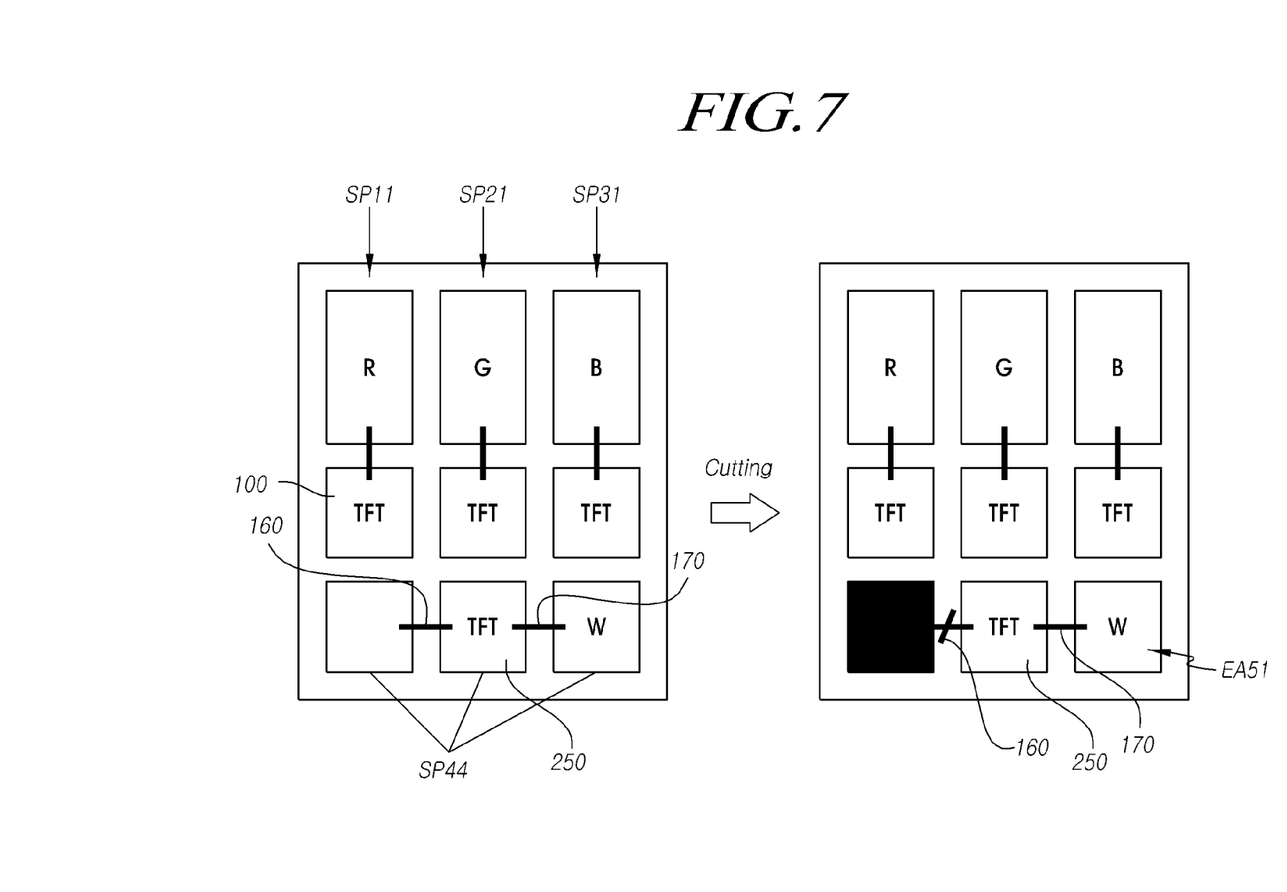

This configuration will be described with reference to FIG. 5 through FIG. 7. FIG. 5 through FIG. 7 are diagrams illustrating a driving method of a fourth sub-pixel when a defect occurs in a fourth light emitting region of the fourth sub-pixel of the organic light emitting display device according to the first example embodiment.

Referring to FIG. 5 through FIG. 7, in a fourth sub-pixel in which two light emitting parts are disposed, a dark spot (illustrated in FIG. 5), semi-dark spot (illustrated in FIG. 6), or bright spot (illustrated in FIG. 7) defect may occur in one of the light emitting parts.

For example, if an electrical short occurs between a first electrode and a second electrode of an organic light emitting element disposed in a fourth light emitting region of a fourth sub-pixel SP42, a dark spot defect may occur in the fourth light emitting region of the fourth sub-pixel SP42 as illustrated in FIG. 5. In this instance, the first electrode 160 of the organic light emitting element that connects the fourth circuit part 250 and the fourth light emitting region of the fourth sub-pixel SP42 is cut to electrically disconnect the fourth light emitting region. Further, the fourth circuit part 250 of the fourth sub-pixel SP42 drives only the fifth light emitting region EA51 which is a normal light emitting part.

Further, if a minute electrical short occurs between a first electrode and a second electrode of an organic light emitting element disposed in a fourth light emitting region of a fourth sub-pixel SP43, a semi-dark spot defect may occur in the fourth light emitting region of the fourth sub-pixel SP43 as illustrated in FIG. 6. In this instance, the first electrode 160 of the organic light emitting element that connects the fourth circuit part 250 and the fourth light emitting region of the fourth sub-pixel SP43 is cut to electrically disconnect the fourth light emitting region. Further, the fourth circuit part 250 of the fourth sub-pixel SP43 drives only the fifth light emitting region EA51 which is a normal light emitting part.

If a transistor connected to an organic light emitting element is not driven in a normal manner due to impurities between a first electrode and a second electrode of the organic light emitting element disposed in a fourth light emitting region of a fourth sub-pixel SP44, specifically, if a short occurs between a source electrode and a drain electrode, the transistor is not driven in a normal manner and a voltage applied to the source/drain electrodes are not turned ON/OFF but are directly applied to the drain/source electrodes. Thus, an excessive current is supplied to the fourth light emitting region and a bright spot defect occurs, so that the fourth light emitting region is seen brighter than the other light emitting regions as illustrated in FIG. 7. In this instance, the first electrode 160 of the organic light emitting element that connects the fourth circuit part 250 and the fourth light emitting region of the fourth sub-pixel SP44 is cut to electrically disconnect the fourth light emitting region. Further, the fourth circuit part 250 of the fourth sub-pixel SP44 drives only the fifth light emitting region EA51 which is a normal light emitting part.

In FIG. 5 through FIG. 7, if a defect occurs in the fifth light emitting region EA51 of the fourth sub-pixels SP42, SP43, and SP44, the first electrode 170 of the organic light emitting element that connects the fourth circuit part 250 and the fifth light emitting region EA51 may be cut to electrically disconnect the fifth light emitting region EA51. Further, the fourth circuit part 250 may drive the fourth light emitting region which is a normal light emitting part.

As described above, since at least one sub-pixel in one pixel P is configured to drive two light emitting parts with one circuit part, even when a defect occurs in one light emitting part, only a part thereof may be darkened and then, the other normal light emitting part may be driven. Therefore, darkening of another sub-pixel caused by misapplication of the algorithm can be suppressed. Since only the light emitting part where a defect occurs is partially darkened, even when a defect occurs, a decrease in a color reproduction range can be suppressed and a dark spot defect occurrence ratio can be improved.

Figure 8:
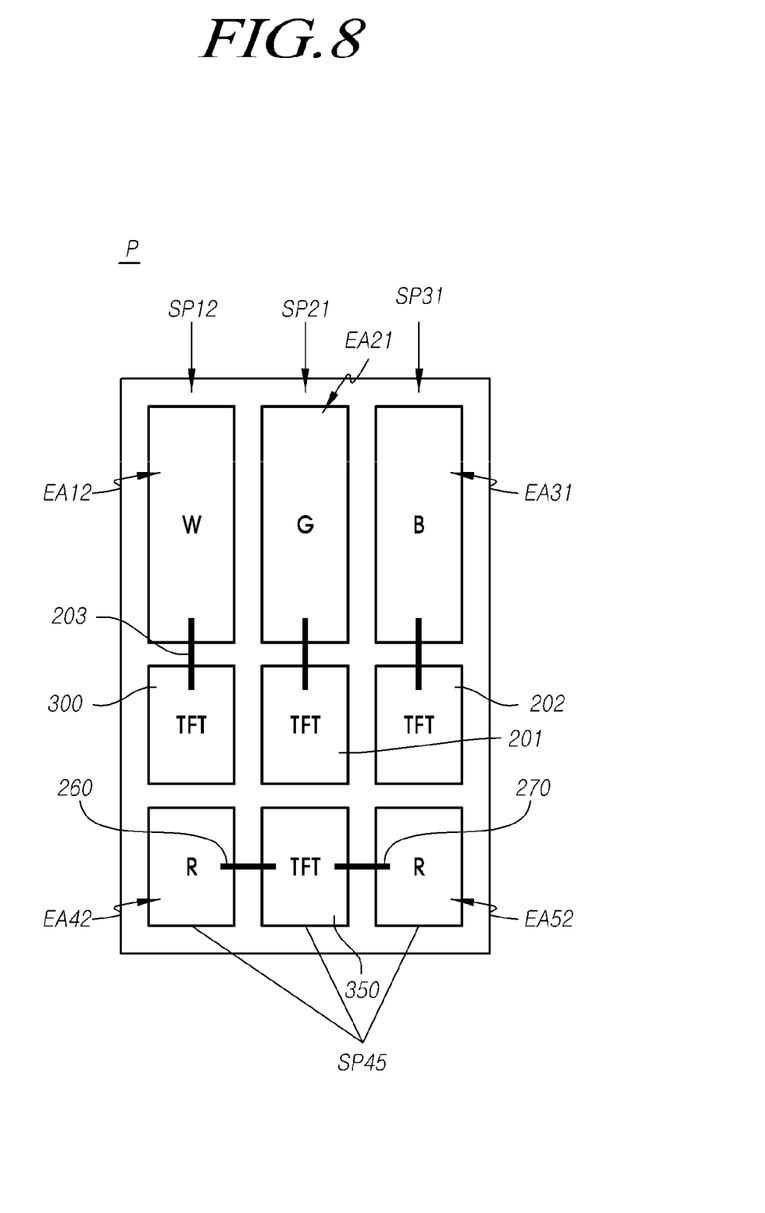
FIG. 8 is a plane view of an organic light emitting display device according to a second example embodiment.

Meanwhile, the organic light emitting display device according to the present example embodiments is not limited thereto, and may be configured as illustrated in FIG. 8. FIG. 8 is a plane view of an organic light emitting display device according to a second example embodiment. The organic light emitting display device according to the second example embodiment may have the same components as those of the above-described example embodiment. The redundant description thereof may be omitted herein. Further, like components are assigned like reference numerals.

Referring to FIG. 8, in the organic light emitting display device according to the second example embodiment, one pixel P includes a first sub-pixel SP12, the second sub-pixel SP21, the third sub-pixel SP31, and a fourth sub-pixel SP45.

Herein, the first sub-pixel SP12 may be a white (W) sub-pixel, the second sub-pixel SP21 may be a green (G) sub-pixel, the third sub-pixel SP31 may be a blue (B) sub-pixel, and the fourth sub-pixel SP45 may be a red (R) sub-pixel. Meanwhile, the first sub-pixel SP12 includes a first light emitting part EA12 and a first circuit part 300, and second sub-pixel SP21 includes the second light emitting part EA21 and the second circuit part 201, and the third sub-pixel SP31 includes the third light emitting part EA31 and the third circuit part 202. The light emitting part and the circuit part in each sub-pixel may be connected to each other through the connection line 203.

Meanwhile, the fourth sub-pixel SP45 may include two light emitting parts EA42 and EA52 and one circuit part 350. To be specific, the fourth sub-pixel SP45 may include the fourth light emitting part EA42 and the fifth light emitting part EA52 and the fourth circuit part 350. Herein, the fourth light emitting part EA42 and the fifth light emitting part EA52 may share the fourth circuit part 350. That is, the two light emitting parts EA42 and EA52 may be driven by the circuit part 350.

Therefore, if any one of the two light emitting parts EA42 and EA52 of the fourth sub-pixel SP45 is determined as being defective, even when a first electrode 260 or 270 of the organic light emitting element included in the defective light emitting part EA42 or EA52 is disconnected from the circuit part 350, the other light emitting part can emit a red (R) light. Therefore, it is possible to implement a clear red (R) light as compared with the instance where the red (R) sub-pixel is entirely shorted.

For example, if a defect occurs due to a defect in the fourth light emitting part EA42 of the fourth sub-pixel SP45, the first electrode 260 between the fourth light emitting part EA42 and the fourth circuit part 350 is cut. Meanwhile, the fourth light emitting part EA42 and the fourth circuit part 350 are electrically shorted, and, thus, the fourth light emitting part EA42 cannot emit a light. However, since the fifth light emitting part EA52 is connected to the fourth circuit part 350, a signal generated from the fourth circuit part 350 may be transferred to the fifth light emitting part EA52. That is, even if the fourth light emitting part EA42 is shorted from the fourth circuit part 350, the fifth light emitting part EA52 can emit a red (R) light. Therefore, it is possible to implement a clear red (R) light as compared with the instance where the red (R) sub-pixel is entirely shorted.

Further, if a bright spot or a dark spot occurs in the fifth light emitting part EA52 of the fourth sub-pixel SP42, the first electrode 270 between the fifth light emitting part EA52 and the fourth circuit part 350 may be cut to short the fifth light emitting part EA52 and the fourth circuit part 350. Then, the fourth circuit part 350 may drive the fourth light emitting part EA42 which is a normal light emitting part.

Figure 9:
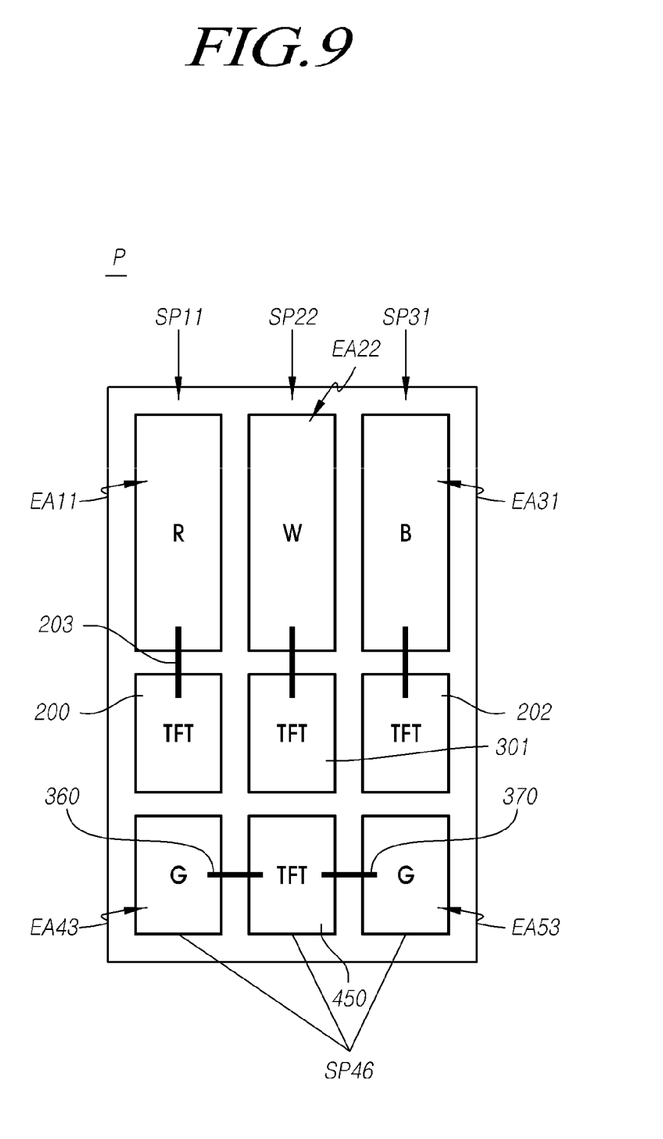
FIG. 9 is a plane view of an organic light emitting display device according to a third example embodiment.

Further, the organic light emitting display device according to the present example embodiments is not limited thereto, and may be configured as illustrated in FIG. 9. FIG. 9 is a plane view of an organic light emitting display device according to a third example embodiment. The organic light emitting display device according to the third example embodiment may have the same components as those of the above-described example embodiments. The redundant description thereof may be omitted herein. Further, like components are assigned like reference numerals.

Referring to FIG. 9, in the organic light emitting display device according to the third example embodiment, one pixel P includes the first sub-pixel SP11, a second sub-pixel SP22, the third sub-pixel SP31, and a fourth sub-pixel SP46.

Herein, the first sub-pixel SP11 may be a red (R) sub-pixel, the second sub-pixel SP22 may be a white (W) sub-pixel, the third sub-pixel SP31 may be a blue (B) sub-pixel, and the fourth sub-pixel SP46 may be a green (G) sub-pixel. Meanwhile, the first sub-pixel SP11 includes the first light emitting part EA11 and the first circuit part 200, the second sub-pixel SP22 includes a second light emitting part EA22 and a second circuit part 301, and the third sub-pixel SP31 includes the third light emitting part EA31 and the third circuit part 202. The light emitting part and the circuit part in each sub-pixel may be connected to each other through the connection line 203.

Meanwhile, the fourth sub-pixel SP46 may include two light emitting parts EA43 and EA53 and one circuit part 450. To be specific, the fourth light emitting parts EA43 and the fifth light emitting part EA53 may share the fourth circuit part 450. That is, the two light emitting parts EA43 and E53 may be driven by the circuit part 450.

Therefore, if any one of the two light emitting parts EA43 and E53 of the fourth sub-pixel SP46 is determined as being defective, even when a first electrode 360 or 370 of the organic light emitting element included in the defective light emitting part EA43 and E53 is disconnected from the fourth circuit part 450, the other light emitting part can emit a green (G) light. Therefore, it is possible to implement a clear green (G) light as compared with the instance where the green (G) sub-pixel is entirely shorted.

Figure 10:
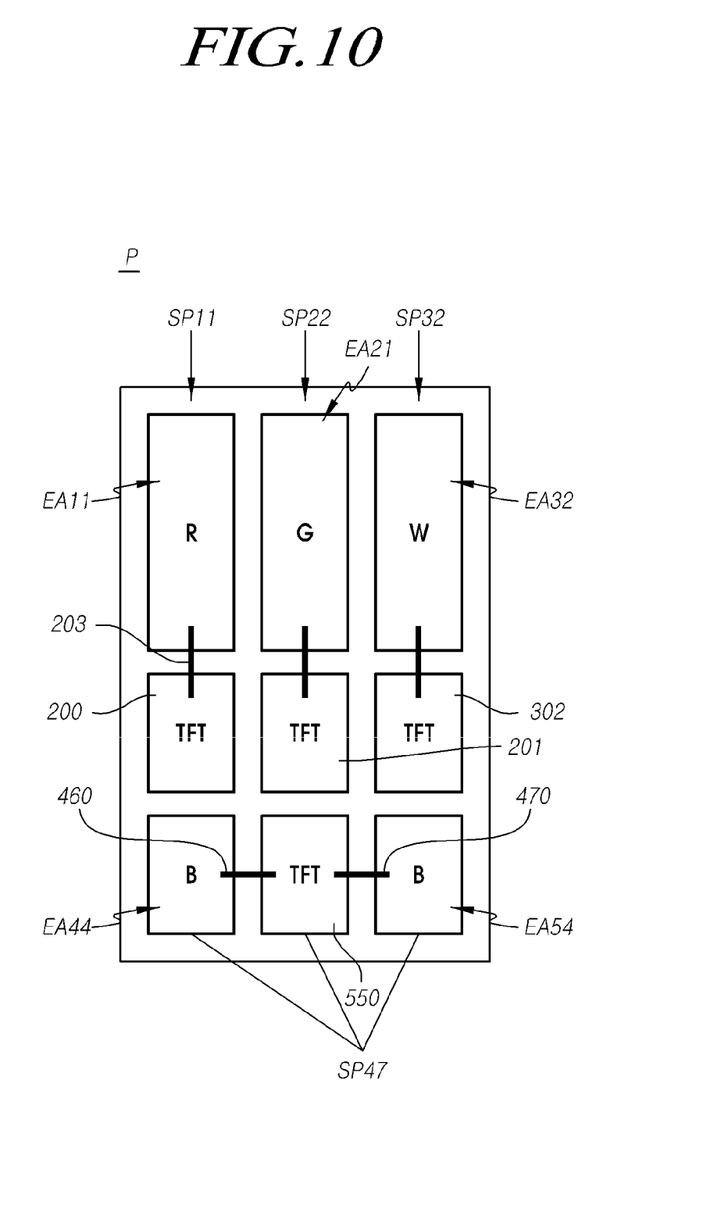
FIG. 10 is a plane view of an organic light emitting display device according to a fourth example embodiment.

Further, the organic light emitting display device according to the present example embodiments is not limited thereto, and may be configured as illustrated in FIG. 10. FIG. 10 is a plane view of an organic light emitting display device according to a fourth example embodiment. The organic light emitting display device according to the fourth example embodiment may have the same components as those of the above-described example embodiments. The redundant description thereof may be omitted herein. Further, like components are assigned like reference numerals.

Referring to FIG. 10, in the organic light emitting display device according to the fourth example embodiment, one pixel P includes the first sub-pixel SP11, the second sub-pixel SP21, a third sub-pixel SP32, and a fourth sub-pixel SP47.

Herein, the first sub-pixel SP11 may be a red (R) sub-pixel, the second sub-pixel SP21 may be a green (G) sub-pixel, the third sub-pixel SP32 may be a white (W) sub-pixel, and the fourth sub-pixel SP47 may be a blue (B) sub-pixel. Meanwhile, the first sub-pixel SP11 includes the first light emitting part EA11 and the first circuit part 200, the second sub-pixel SP21 includes the second light emitting part EA21 and the second circuit part 201, and the third sub-pixel SP32 includes a third light emitting part EA32 and a third circuit part 302. The light emitting part and the circuit part in each sub-pixel may be connected to each other through the connection line 203.

Meanwhile, the fourth sub-pixel SP47 may include two light emitting parts EA44 and EA54 and one circuit part 550. In this instance, the fourth light emitting parts EA44 and the fifth light emitting part EA54 may share the circuit part 550. That is, the two light emitting parts EA44 and E54 may be driven by the circuit part 550.

Therefore, if any one of the two light emitting parts EA44 and EA54 of the fourth sub-pixel SP47 is determined as being defective, even when a first electrode 460 or 470 of the organic light emitting element included in the defective light emitting part EA44 and EA54 is disconnected from the fourth circuit part 550, the other light emitting part can emit a blue (B) light. Therefore, it is possible to implement a clear blue (B) light as compared with the instance where the blue (B) sub-pixel is entirely shorted.

As described above, since at least one sub-pixel in one pixel of the organic light emitting display device according to the present example embodiments is configured to drive at least two light emitting parts with one circuit part, even when a sub-pixel defect such as a dark spot or a bright spot occurs, only the light emitting part where a defect occurs is electrically shorted while the other light emitting part is driven in a normal manner. Accordingly, a defect occurrence ratio caused by dark spot and bright spot defects can be improved and the visibility can also be improved.

Further, at least one sub-pixel in a pixel of the organic light emitting display device according to the present example embodiments is disposed in a direction intersecting with a direction in which the other sub-pixels are disposed. Accordingly, an aperture ratio can be improved.

The features, structures, effects, etc., described in the above example embodiments are included in at least one example embodiment and but are not limited to one example embodiment. In addition, the features, structures, effects, etc., described in the respective example embodiments may be executed by those skilled in the art while being combined or modified with respect to other embodiments. Accordingly, it will be understood that contents related the combination and modification will be included in the scope of the present disclosure.

Further, it should be understood that the example embodiments described above should be considered in a descriptive sense only and not for purposes of limitation. It will be understood by those skilled in the art that various other modifications and applications may be made therein without departing from the spirit and scope of the example embodiments. For example, respective components shown in detail in the example embodiments may be executed while being modified.

What is claimed is:

1. A panel comprising:
   a plurality of pixels, each pixel including a plurality of sub-pixels;
   a plurality of transistors including a single transistor including a source electrode and a drain electrode,
   wherein at least one of the plurality of sub-pixels in the each pixel has a plurality of light emitters that are all light emitting and coplanar,
   wherein the single transistor is connected to the plurality of light emitters to drive the plurality of light emitters to all emit light,
   wherein the plurality of light emitters include respective pixel electrodes, and the respective pixel electrodes are directly contacted with the source electrode or the drain electrode of the single transistor,
   wherein the plurality of sub-pixels include a first light emitter connected to a first transistor, a second light emitter connected to a second transistor, and a third light emitter connected to a third transistor, the first, second and third light emitters emitting lights of different colors from each other, the first, second and third light emitters being disposed in a horizontal direction, and the plurality of sub-pixels further include the at least one of the plurality of sub-pixels in a direction intersecting with a direction in which the first light emitter to the third light emitter are disposed,
   wherein the at least one of the plurality of sub-pixels includes a fourth light emitter, a fifth light emitter and the single transistor,
   wherein the fourth light emitter and the fifth light emitter emit the same color as each other, and
   wherein the first transistor is disposed between the first light emitter and the fourth light emitter, the second transistor is disposed between the second light emitter and the single transistor and the third transistor is disposed between the third light emitter and the fifth light emitter.

2. The panel of claim 1, wherein some of the light emitted from the plurality of light emitters has the same color.

3. The panel of claim 1, wherein the single transistor further comprises:
   a substrate;
   a buffer layer disposed on the substrate;
   a gate electrode disposed on the buffer layer;
   a gate insulation film disposed on the gate electrode; and
   an active layer overlapped with the gate electrode and disposed on the gate insulation film.

4. The panel of claim 3, wherein the single transistor further comprises:
   the drain electrode and the source electrode being separated from each other and disposed to be overlapped with the active layer;
   an interlayer insulation film disposed on the drain electrode and the source electrode; and
   an overcoating layer disposed on the interlayer insulation film.

5. The panel of claim 4, wherein the single transistor further comprises:
a plurality of contact holes in the interlayer insulation film and the overcoating layer through which one of the drain electrode and the source electrode is exposed,
wherein the respective pixel electrodes of the plurality of light emitters are directly contacted to the one of the drain electrode and the source electrode by extending through the plurality of contact holes, respectively.

6. The panel of claim 5, wherein the plurality of light emitters are two in number and the plurality of contact holes are two in number.

7. The panel of claim 6, wherein the two contact holes are on the source electrode or the drain electrode.

8. The panel of claim 5, further comprising a bank pattern, wherein the bank pattern partially exposes top surfaces of the respective pixel electrodes of the plurality of light emitters.

9. The panel of claim 8, wherein the respective pixel electrodes of the plurality of light emitters are separately connected to one of the source electrode and the drain electrode.

10. The panel of claim 8, wherein the respective pixel electrodes are separate at a disconnected portion.

11. The panel of claim 10, wherein the bank pattern directly contacts the overcoating layer at the disconnected portion.

12. The panel of claim 8, further comprising an organic light emitting layer disposed on the bank pattern and the respective pixel electrodes.

13. The panel of claim 12, wherein the organic light emitting layer is shared by the respective pixel electrodes.

14. The panel of claim 12, wherein each pixel electrode has a separate organic light emitting layer.

15. An organic light emitting display device comprising:
the panel of claim 1, wherein the panel further comprises:
a plurality of data lines;
a plurality of gate lines;
a data driver to drive the plurality of data lines;
a gate driver to drive the plurality of gate lines; and
a timing controller to control the data driver and the gate driver.

16. The panel of claim 1, wherein the first light emitter emits red light, the second light emitter emits green light, the third light emitter emits blue light, and the fourth and the fifth emitters emit same white light.

17. A repairing method of a panel, the method comprising:
forming a plurality of transistors including a single transistor including a source electrode and a drain electrode, and a plurality of pixels, each pixel including a plurality of sub-pixels,
wherein at least one of the plurality of sub-pixels in the each pixel has a plurality of light emitters including respective pixel electrodes, and the single transistor is connected to the plurality of light emitters that are coplanar to drive the plurality of light emitters, and the respective pixel electrodes are directly contacted with the source electrode or the drain electrode of the single transistor,
wherein the forming of the single transistor and the plurality of pixels forms the plurality of sub-pixels to include a first light emitter connected to a first transistor, a second light emitter connected to a second transistor, and a third light emitter connected to a third transistor, the first, second and third light emitters emitting lights of different colors from each other, the first, second and third light emitters being disposed in a horizontal direction, and the plurality of sub-pixels further include the at least one of the plurality of sub-pixels in a direction intersecting with a direction in which the first light emitter to the third light emitter are disposed,
wherein the at least one of the plurality of sub-pixels includes a fourth light emitter, a fifth light emitter and the single transistor,
wherein the fourth light emitter and the fifth light emitter emit the same color as each other, and
wherein the first transistor is disposed between the first light emitter and the fourth light emitter, the second transistor is disposed between the second light emitter and the single transistor and the third transistor is disposed between the third light emitter and the fifth light emitter;
determining whether the plurality of light emitters are able to emit light; and
electrically disconnecting at least one light emitter among the plurality of light emitters from the single transistor when the at least one light emitter does not emit the light.

18. The repairing method of claim 17, wherein the electrically disconnecting step physically cuts a connection between a first electrode of an organic light emitter disposed in each of the plurality of light emitters and the single transistor.

19. The repairing method of claim 17, wherein the forming of the single transistor and the plurality of pixels includes:
forming the drain electrode and the source electrode of the single transistor, which are separated from each other and disposed to be overlapped with an active layer of the single transistor,
forming an interlayer insulation film disposed on the drain electrode and the source electrode,
forming an overcoating layer disposed on the interlayer insulation film, and
forming a plurality of contact holes in the interlayer insulation film and the overcoating layer through which one of the drain electrode and the source electrode is exposed, wherein the respective pixel electrodes of the plurality of light emitters are directly contacted to the one of the drain electrode and the source electrode by extending through the plurality of contact holes, respectively.

* * * * *